(12) United States Patent
Hsu et al.

(10) Patent No.: US 9,633,953 B2
(45) Date of Patent: Apr. 25, 2017

(54) METHODOLOGY TO ACHIEVE ZERO WARPAGE FOR IC PACKAGE

(71) Applicant: Apple Inc., Cupertino, CA (US)

(72) Inventors: Jun Chung Hsu, Taoyuan (TW); Jie-Hua Zhao, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 90 days.

(21) Appl. No.: 14/518,887

(22) Filed: Oct. 20, 2014

(65) Prior Publication Data

US 2016/0071807 A1    Mar. 10, 2016

Related U.S. Application Data

(60) Provisional application No. 62/046,117, filed on Sep. 4, 2014.

(51) Int. Cl.
| | |
|---|---|
| *H01L 23/48* | (2006.01) |
| *H01L 23/00* | (2006.01) |
| *H01L 23/498* | (2006.01) |
| *H01L 23/31* | (2006.01) |

(52) U.S. Cl.
CPC ........ *H01L 23/562* (2013.01); *H01L 23/3128* (2013.01); *H01L 23/49822* (2013.01); *H01L 23/49838* (2013.01); *H01L 23/49866* (2013.01); *H01L 2224/16225* (2013.01); *H01L 2924/15311* (2013.01); *H01L 2924/18161* (2013.01)

(58) Field of Classification Search
None
See application file for complete search history.

(56) References Cited

U.S. PATENT DOCUMENTS

| | | | |
|---|---|---|---|
| 6,747,356 B2 | 6/2004 | Ando et al. | |
| 7,068,491 B1* | 6/2006 | Burdon | H01G 4/35 361/313 |
| 7,880,094 B2 | 2/2011 | Chi et al. | |
| 2005/0184377 A1* | 8/2005 | Takeuchi | H01L 21/6835 257/686 |
| 2007/0205520 A1* | 9/2007 | Chou | H01L 23/3157 257/780 |
| 2012/0018863 A1* | 1/2012 | Oganesian | H01L 21/76898 257/676 |
| 2012/0318563 A1 | 12/2012 | Ookawa | |

* cited by examiner

*Primary Examiner* — Ali Naraghi
(74) *Attorney, Agent, or Firm* — Blakely, Sokoloff, Taylor & Zafman LLP

(57) ABSTRACT

A methodology for addressing package warpage is described. In an embodiment a package includes a die mounted on a wiring board. Portion of a metal plane within the wiring board includes a reduced portion, characterized by a reduced thickness that is less than a baseline thickness.

20 Claims, 7 Drawing Sheets

|     |                              |                              |                              |
| --- | ---------------------------- | ---------------------------- | ---------------------------- |
| M1: | $AR_{M1B} = t_{BaB}:t_{RB}$  | $AR_{M1A} = t_{BaA}:t_{RA}$  | $AR_{M1B} = t_{BaB}:t_{RB}$  |
| M2: | $AR_{M2B} = t_{BaB}:t_{RB}$  | $AR_{M2A} = t_{BaA}:t_{RA}$  | $AR_{M2B} = t_{BaB}:t_{RB}$  |
| ⋮   | ⋮                            | ⋮                            | ⋮                            |
| Mn: | $AR_{MnB} = t_{BaB}:t_{RB}$  | $AR_{MnA} = t_{BaA}:t_{RA}$  | $AR_{MnB} = t_{BaB}:t_{RB}$  |
| M(sum): | $AR_{(sum\ MB)} = t_{BaB}:t_{RB}$ | $AR_{(sum\ MA)} = t_{BaA}:t_{RA}$ | $AR_{(sum\ MB)} = t_{BaB}:t_{RB}$ |

METHODOLOGY TO ACHIEVE ZERO WARPAGE FOR IC PACKAGE

RELATED APPLICATIONS

This application claims the benefit of priority from U.S. Provisional Patent Application Ser. No. 62/046,117 filed on Sep. 4, 2014, the full disclosure of which is incorporated herein by reference.

FIELD

Embodiments described herein relate to semiconductor packaging. More particularly embodiments relate to a methodology for addressing package warpage.

BACKGROUND INFORMATION

Direct mounting techniques such as flip-chip mounting (FC), direct chip attach (DCA), direct die attach (DDA), and flip chip on board (FCOB) generally involve the fixing of an integrated circuit (IC) die to a printed wiring board (PWB) substrate. The IC die is then encapsulated on the PWB substrate with a molding compound.

As advanced wafer node technologies dictate IC die with higher I/O count, larger body size, and smaller bump pitch, IC die packaging is facing more challenges for warpage concern, particularly under high temperature exposure during solder bump reflow. A common failure mode is known as controlled collapse chip connection (C4) bump short/open (cold joint) or solder ball cold joint on a ball grid array (BGA) ball. As BGA pitch continues to be reduced, package warpage causes cold joints, which affect interconnection reliability and assembly yield. Additionally, cold joints are often not detected during final package testing, since a test normally applies a force on the test probe to maintain physical contact with the IC die. This force can press the package down which makes the solder joint operable during testing, but the joint fails in normal operating conditions.

SUMMARY

A methodology for addressing package warpage is described. In an embodiment, a semiconductor package includes a die mounted on a wiring board. The wiring board includes a metal trace characterized by a uniform baseline thickness, and a metal plane adjacent the metal trace. The metal plane includes a baseline portion of the baseline thickness and a reduced portion of a reduced thickness which is less than the baseline thickness. In an embodiment, an area of the reduced thickness of the metal plane is directly below the die. The metal plane may be laterally adjacent (e.g. in the same metal layer) or vertically adjacent the metal trace (e.g in separate metal layers). In an embodiment the metal trace is a signal line trace. In an embodiment, the metal plane is a ground plane, power plane, or reference plane. In an embodiment, the one or more metal layer are copper layers.

In accordance with embodiments, the metal volume (e.g. copper volume) in one or more metal layers is adjusted to address package warpage. For example, this may be accomplished by selective etching of metal planes from a baseline thickness to a reduced thickness. In an embodiment, the wiring board includes a first metal trace characterized by a first area ratio of the baseline thickness to reduced thickness directly below the die, and a second area ration of the baseline thickness to reduced thickness outside of the die not directly below the die. In an embodiment, the second area ratio is greater than the first area ratio.

In an embodiment, the wiring board includes a plurality of metal layers, and each metal layers includes a baseline thickness and a reduced thickness. Each of the metal layers is characterized by a first area ratio sum of the plurality of metal layers of the baseline thicknesses to reduced thicknesses directly below the die, and a second area ratio sum of the plurality of metal layers of the baseline thicknesses to reduced thicknesses outside of the die not directly below the die. In an embodiment, the second area ratio sum is greater than the first area ratio sum.

DETAILED DESCRIPTION

Figure 1:
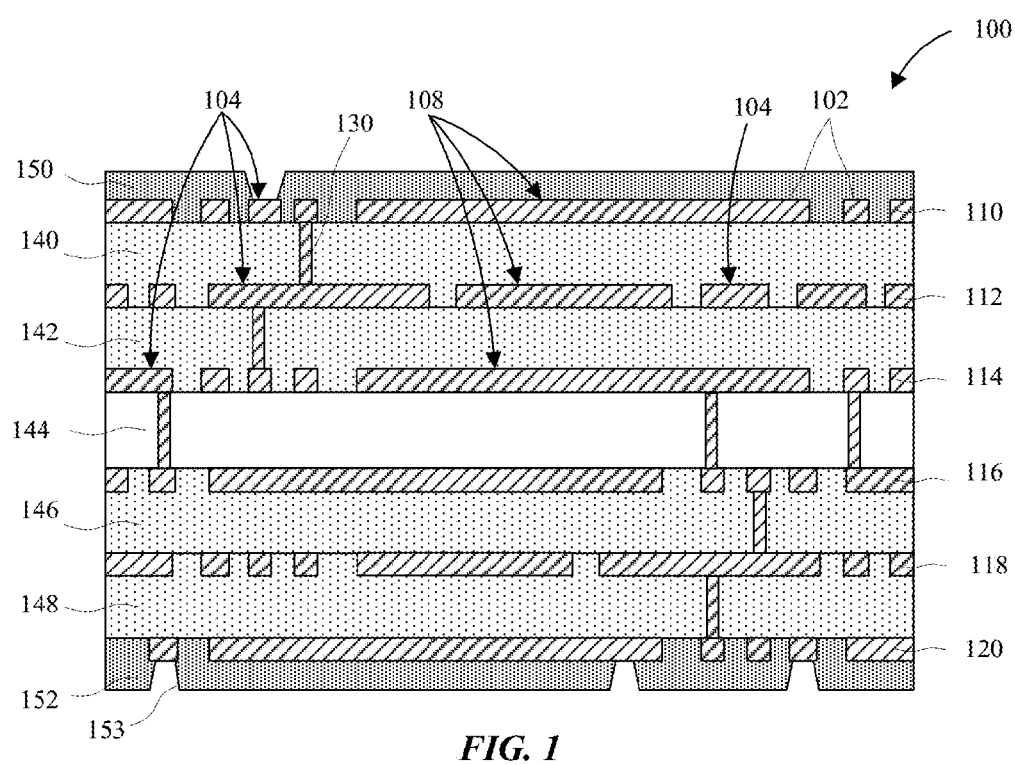
FIG. 1 a schematic cross-sectional side view illustration of a wiring board.

Embodiments describe a methodology for addressing package warpage. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between" and "on" as used herein may refer to a relative position of one layer with respect to other layers. One layer "above", "over" or "on"

another layer or bonded "to" or in "contact" with another layer may be directly in contact with the other layer or may have one or more intervening layers. One layer "between" layers may be directly in contact with the layers or may have one or more intervening layers.

In one aspect, embodiments describe a semiconductor package in which a wiring board has been patterned to address package warpage. In an embodiment, the wiring board includes a metal trace characterized by a uniform baseline thickness and a metal plane adjacent the metal trace. The metal plane includes a baseline portion of the baseline thickness and a reduced portion of a reduced thickness, in which the reduced thickness is less than the baseline thickness. As used herein, the terms baseline thickness and reduced thickness correspond to the relative thickness of a metal layer, not including a corresponding via that may be attached to the metal layer, for example, connecting two metal layers. A die is mounted on the wiring board. Area ratios of the baseline thickness and reduced thickness within the mounting board can be adjusted to address warpage of a package including the die mounted on the wiring board.

It has been observed that while market needs are driving increased IC die sizes with decreased wafer node technologies, package dimensions remain the same or are becoming smaller. One application where this is evident is mobile devices. In this sense, the volume ratio of silicon to package is increased. This results in an upper package part with an IC die (silicon) and molding compound equivalent coefficient of thermal expansion (CTE) that is lower since the CTE of silicon, approximately 3 ppm/° C., is lower compared to the molding compound. Organic wiring boards have made some advances toward CTE matching of the attached IC die using a glass fabric and resin system. Furthermore, low CTE cores have been introduced to a wiring board to provide stiffness and minimize CTE mismatch with the top portion (die and molding compound).

Generally, a wiring board includes alternating dielectric layers and wiring layers, typically copper. If copper wiring were completely removed, a wiring board substrate could have an equivalent CTE as low as 2 ppm/° C., for example. However, copper, with a CTE of approximately 17 ppm/° C. is an industry adopted wiring material. Accordingly, copper volume is a key factor in equivalent CTE of a wiring board, and therefore package warpage associated with local and global CTE mismatch.

While copper volume is a key factor in equivalent CTE of a wiring board, simply adopting thinner copper wiring layers or removing copper planes may have unintended consequences on the package. Accordingly, certain package design considerations may need to be complied with when adjusting copper volume in a wiring board. For example, too thin of a copper trace may crack at high stress locations, such as at die corners. Too thin of a copper trance may additionally affect resistance and impedance, which may be important for electrical performance. Plated copper wiring layers may also need to be thick enough in order to fill vias or through holes between copper layers in the wiring board. Removal of copper planes also appears unfeasible. For example, power and ground planes are located at I/O pins. Copper reference layers also provide a shielding function for crosstalk or electromagnetic interference (EMI) prevention. In addition, accumulated lack of copper area may induce local impact of stiffness reduction or distortion.

It has been observed that within a single copper wiring layer in a wiring board that copper planes often occupy 80% of the overall copper volume within the layer, with copper signal traces accounting for the other 20%. In one aspect, embodiments describe a methodology in which copper volume (calculated by area of copper thickness) is locally reduced at specific locations in the copper planes within the same copper layer. For instance a copper layer may include an exemplary 15 μm thick copper signal trace line with uniform thickness and a copper plane (e.g. power/ground/reference) including a baseline portion that is 15 μm thick and a reduced portion that is 7.5 μm thick (for example). In this manner, a designer is free to define areas of the reduce portion with reduced copper thickness to achieve a determined value of copper volume. In addition, selective reduction of thickness for specific locations in the copper planes does not require copper volume reduction in the copper traces.

In another aspect, embodiments describe a methodology of addressing package warpage that provides flexibility for a designer to assign the copper volume for each layer, and at specific locations. Embodiments describe a methodology that allows for copper volume to be tailor made for each device, and package warpage behavior to be manipulated. Thus, controlling copper volume in the multiple copper layers allows for control and improvement of local warpage of a small area in a package. Likewise, the global package profile and topography (contour) can be controlled and improved accordingly. In addition, control of package contour may additionally result in reduced Z-height of the package.

In an embodiment, a simulation tool is utilized to predict package warpage. For example, both global and local package warpage may be predicted, and in high resolution on the order of 1 mm by 1 mm. In one application, the simulation tool may be used to predict package warpage prior to fabrication of the wiring board substrate. In another application, the simulation tool may be used to address warpage measured on an actual package as part of a new product introduction cycle. Thus, a designer may utilize simulation data to fine-tune an area ratio of baseline thickness to reduced thickness at specified areas of a package in order to control or reduce package warpage.

While specific embodiments are described with regard to copper layers in a wiring board, the embodiments are not so limited. For example, embodiments may be applicable to wiring boards and packages including metal layers other than copper, or electrically conductive layers other than metal. Additionally, while embodiments are described with an exemplary baseline thickness of 15 μm, and reduced thickness of 7.5 μm these thicknesses are intended to be exemplary and embodiments are not so limited.

Referring now to FIG. 1, a schematic side view illustration is provided of a wiring board 100. As illustrated, wiring board 100 includes a plurality of metal layers 110, 112, 114, 116, 118, 120 separated by a plurality of dielectric layers 140, 142, 146, 148. Top passivation layer 150 may at least partially cover metal layer 110, and bottom passivation layer 152 may at least partially cover metal layer 120. Openings 153 can be formed through the top and bottom passivation layers 152 for electrical connection with the outer most metal layers 110, 120 of the wiring board 100, for example, with solder bumps. The wiring board 100 may additionally include a core layer 144, for example, to support a specific coefficient of thermal expansion or provide structural support. Core layer 144 may be formed of a variety of materials including, but not limited to, semiconductor, ceramic, polymer, glass fiber and resin, and metal. Dielectric layers 140, 142, 146, 148 provide electrical insulation between metal layers 110, 112, 114, 116, 118, 120. In an embodiment, dielectric layers 140, 142, 146, 148 are laminate resin layers, such as epoxy or bismaleimide-triazine resin, and may include a filler such as glass fibers. Metal layers 110, 112, 114, 116, 118, 120 may be plated layers, or foil layers for example. Vias 130 may extend through one or more dielectric layers 140, 142, 146, 148 and/or core layer 144 to provide electrical connection between the metal layers 110, 112, 114, 116, 118, 120. In an embodiment, vias are formed by laser drilling or etching through a dielectric layer 140, 142, 146, 148 and/or core layer 144 followed by plating.

The wiring board 100 illustrated and described with regard to FIG. 1 is exemplary of a 6 L substrate design, with the core considered as a neutral axis. The total copper volume difference above (metal layers 110, 112, 114) and under the neutral axis (metal layers 116, 118, 120) may affect package level warpage due to effective CTE difference above and under the core. The 6 L substrate design with core is intended to be exemplary and embodiments are not so limited. For example, embodiments may be applicable with coreless substrate, 4 L substrates, high density interconnect (HDI) substrates, etc. Embodiments may be applicable to a variety of wiring board configurations including one or more metal layers with metal traces and metal planes.

Still referring to FIG. 1, the wiring board 100 includes a metal trace 104 characterized by a uniform thickness 102 and a metal plane 108 adjacent the metal trace 104. For example, the metal plane 108 is laterally adjacent the metal trace 104 in the same metal layer of the wiring board, or in a different metal layer than the metal trace such that the metal plane 108 is vertically adjacent the metal trace 104. Referring to FIG. 1, each metal layer is characterized by a uniform baseline thickness 102, which may be the same across a single metal layer, though each metal layer may have a different uniform baseline thickness 102.

Figure 2:
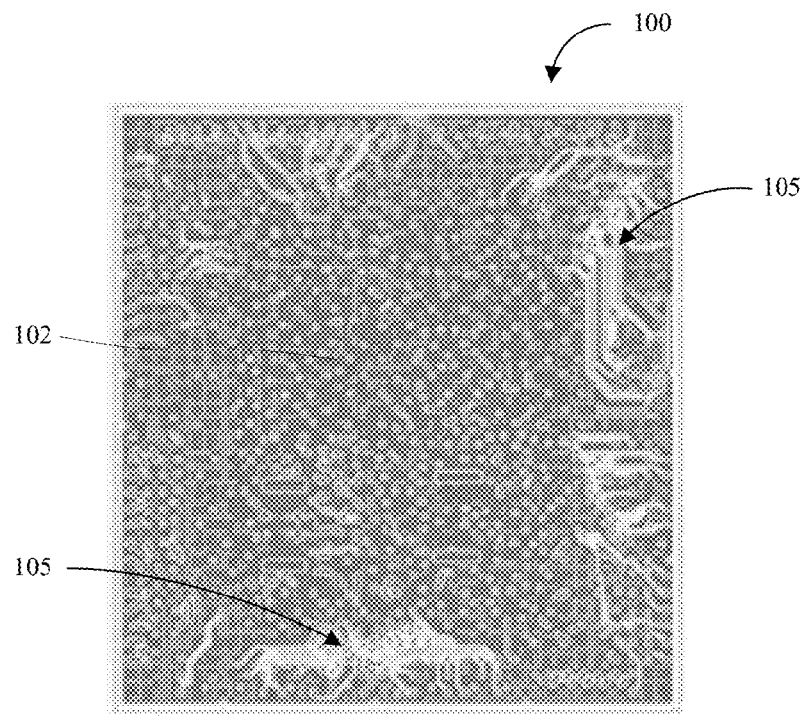
FIG. 2 a schematic top view illustration of a wiring board metal layer.

Referring now to FIG. 2 a schematic top view illustration is provided of a wiring board 100 metal layer, which can be any of metal layers 110, 112, 114, 116, 118, 120. As illustrated, the metal trace lines 104 are shown as white lines superimposed over a shaded background that represents a baselines thickness 102 of the metal layer. Regions 105 correspond to high density regions of metal trace lines 104. As illustrated in FIG. 2, the uniform shading demonstrates a uniform thickness 102 of the metal layer 110, 112, 114, 116, 118, or 120.

Figure 3:
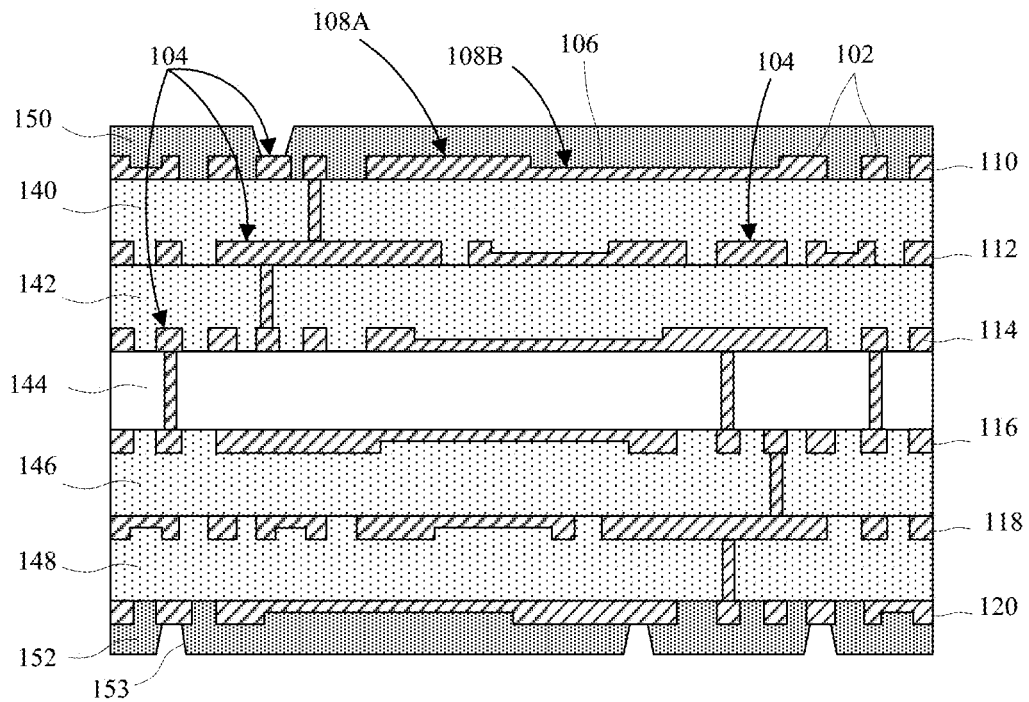
FIG. 3 a schematic cross-sectional side view illustration of a wiring board in accordance with an embodiment.
Figure 4:
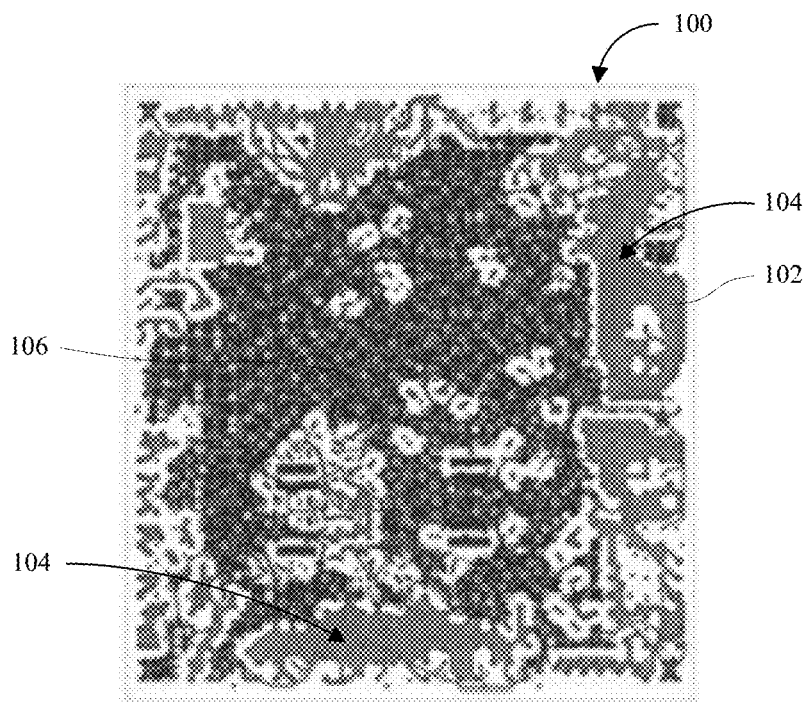
FIG. 4 a schematic top view illustration of a wiring board metal layer in accordance with an embodiment.

Referring now to FIGS. 3-4, schematic cross-sectional and side view illustrations are provided of a wiring board 100 including one or more metal layers in which a metal plane 108 has been patterned to include a baseline portion 108A of the baseline thickness 102, and a reduced portion 108B of a reduced thickness 106, in which the reduced thickness is less than the baseline thickness. Similar to FIG. 2, FIG. 4 is a schematic top view illustration is provided of a wiring board 100 metal layer, which can be any of metal layers 110, 112, 114, 116, 118, 120. As shown, the area of reduced thickness 106 of the metal layer is illustrated with a darker shaded region than the area of baseline thickness 102 of the metal layer. Comparing FIG. 2 and FIG. 4, the high density regions 105 of metal trace lines are shown as having a baseline thickness 102.

In accordance with embodiments, a designer is able to assign the metal volume for each metal layer at specific locations, and for each metal layer. This methodology thus allows for the opportunity to skew copper volume and manipulate package warpage. FIGS. 5-8 are schematic cross-sectional side view illustrations for a method of reducing copper volume in a single metal layer in accordance with an embodiment.

Figure 5:
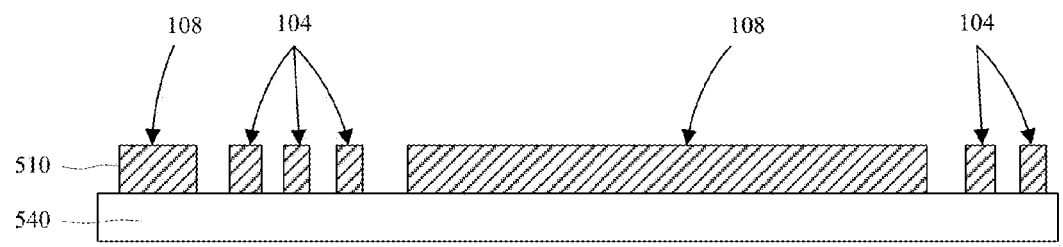
FIGS. 5-8 are schematic cross-sectional side view illustrations for a method of reducing a thickness of a metal layer in accordance with an embodiment.
Figure 6:
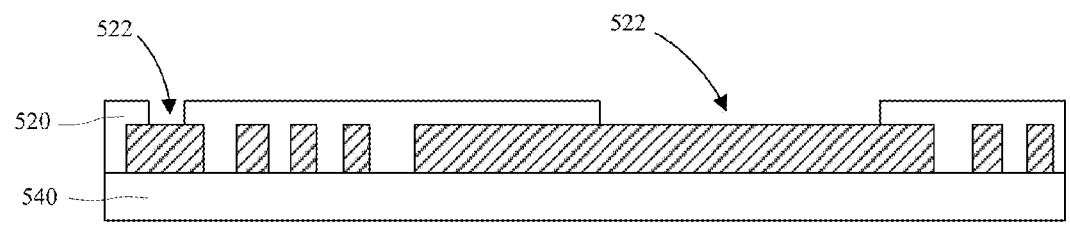
Figure 7:
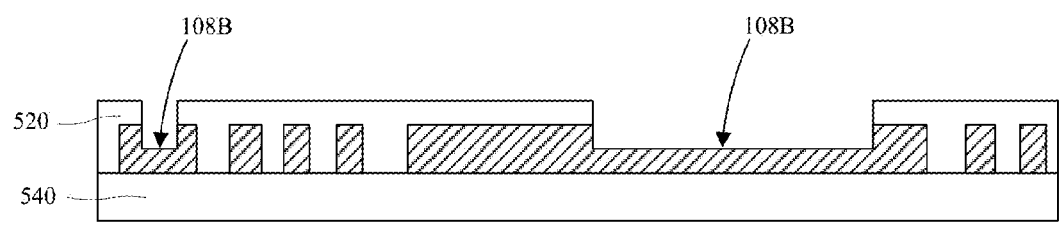
Figure 8:
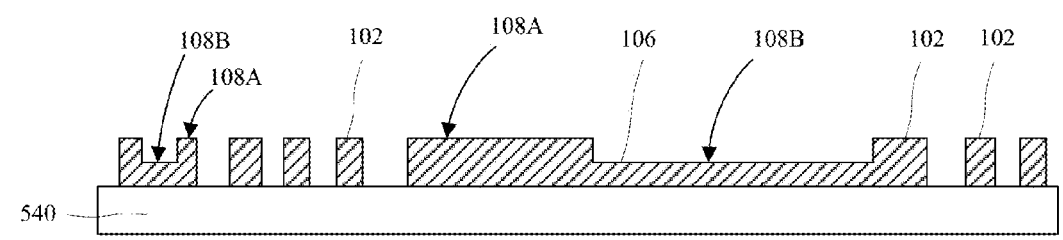

Referring now to FIG. 5, a schematic cross-sectional side view illustration is provided of a metal layer 510 on a supporting layer 540. Metal layer 510 may be any of the metal layers 110, 112, 114, 116, 118, 120 in an exemplary 6 L substrate design. Supporting layer 540 may be any of the dielectric layers or 140, 142, 146, 148 or core layer 144 in an exemplary 6 L substrate design. Metal layer 510 may be formed on supporting layer 540 for example by lamination or plating. The metal layer is etched to form reduced portions 108B with a reduced thickness 106 within one or more metal planes 108, in which the reduced thickness is less than the baseline thickness 102 of the metal layer 510. Referring to FIGS. 6-8, in an embodiment this is performed by patterning a photoresist layer 520 to include openings 522 corresponding to the area of the reduced portions 108B to be formed, etching of the metal layer 510, and removal of the photoresist layer 520. Etching of the metal layer may be performed using any suitable etching technique, including a micro etching solution. Following removal of the photoresist, a dielectric layer such as one of dielectric layers 140, 142, 146, 148 or passivation layer 150, 152 is formed over the patterned metal layer 510.

Figure 9A:
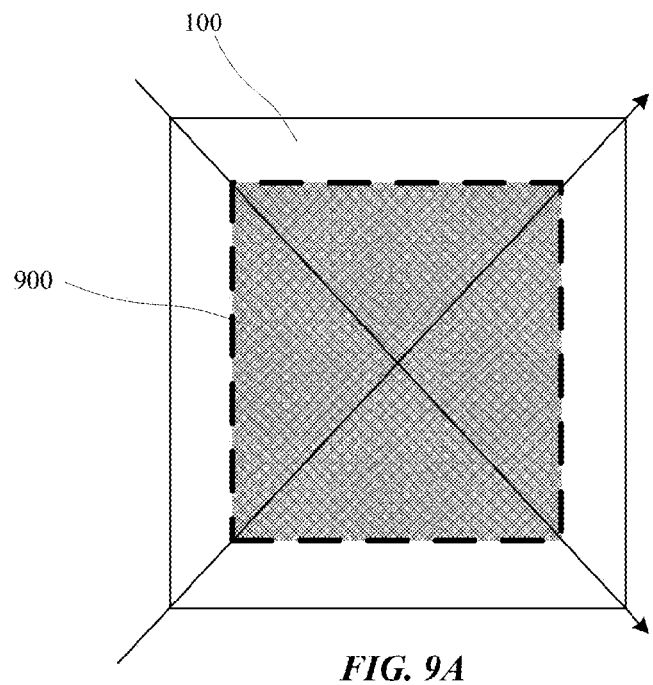
FIG. 9A is a schematic top view illustration of a package in accordance with an embodiment.
Figure 9B:
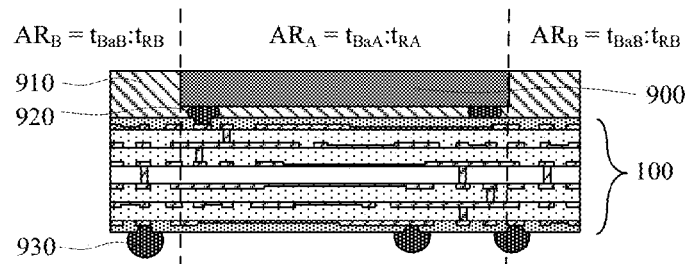
FIG. 9B a schematic cross-sectional side view illustration of a package in accordance with an embodiment.

In accordance with embodiments, package warpage behavior may be manipulated by reducing the thickness of select areas of copper planes within one or more metal layers. FIGS. 9A-9B are schematic top view and side view illustrations of a 6 L flip chip, chip scale package (FCCSP) in accordance with an embodiment. As illustrated, a die 900 is mounted onto a 6 L wiring board substrate 100 and joined with solder bumps 920. Following mounting, the die 900 is encapsulated with a molding compound 910, such as an epoxy molding compound. Solder bumps 930 may additionally be provided on the bottom surface of the wiring board 100. A final singulated package is illustrated in FIGS. 9A-9B in accordance with an embodiment.

Figure 9C:
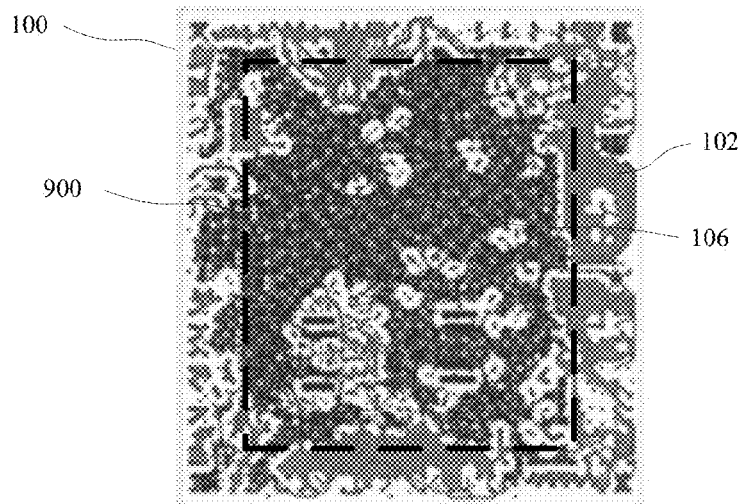
FIG. 9C a schematic top view illustration of a wiring board metal layer in accordance with an embodiment.

Referring now to FIG. 9C along with FIG. 9B, a schematic top view illustration of the package is provided illustrating the outline of the IC die 900 over the wiring board 100, as well as the reduced thickness 106 areas and baseline thickness 102 areas for a metal layer within the wiring board 100. In accordance with embodiments, the area ratios of the baseline thickness $t_{Ba}$ to reduced thickness $t_R$ within the mounting board can be adjusted to address warpage of a package including the IC die mounted on the wiring board. In the embodiment illustrated, within a single metal layer the area ratio directly below the IC die 900 is represented as $AR_A$, with the ratio represented by the area of baseline thickness $t_{BaA}$ to the area of reduced thickness $t_{RA}$. Thus, the (copper) area ratio directly below the die 900 is represented by equation (1):

$$AR_A = t_{BaA}:t_{RA} \qquad (1)$$

where, $t_{BaA}$ corresponds to the total baseline thickness 102 area of the metal layer directly below the IC die, including both the metal traces 104 and baseline portions 108A of the metal planes 108, and $t_{RA}$ corresponds to the total area of reduced portions 108B of the metal planes 108 directly below the IC die.

In the embodiment illustrated, within a single metal layer the area ratio outside the IC die 900 and not directly below the IC die 900 is represented as $AR_B$, with the ratio represented by the area of baseline thickness $t_{BaB}$ to the area of reduced thickness $t_{RB}$. Thus, the (copper) area ratio outside the IC die 900 and not directly below the IC die 900 is represented by equation (1):

$$AR_B = t_{BaB}:t_{RB} \qquad (2)$$

where, $t_{BaB}$ corresponds to the total baseline thickness 102 area of the metal layer outside the IC die and not directly below the IC die, including both the metal traces 104 and baseline portions 108A of the metal planes 108, and $t_{RB}$ corresponds to the total area of reduced portions 108B of the metal planes 108 outside the IC die and not directly below the IC die.

In an embodiment, $AR_B$ is greater than $AR_A$. This is illustrated in FIG. 9C, where a larger area of reduced thickness 106 is visually represented directly below the IC die 900, and a larger area of baseline thickness 102 is visually represented outside of the IC die 900, around IC die 900. The relative area ratios $AR_A$ and $AR_B$ can be attributed to a number of factors depending upon the design. In an embodiment, the designer reduces $AR_A$ directly below the die a specified amount by reducing a thickness the metal planes 108 directly below the IC die. In an embodiment, $AR_A$ is reduced to address localized warpage due to the CTE and stiffness difference between the IC die 900, molding compound 910, and wiring board 100. Referring to FIG. 9B, in an embodiment, the molding compound 910 laterally surrounding the IC die 900 has a larger CTE than the IC die 900. In an embodiment, the area ratio $AR_A$ directly below the IC die 900 is reduced to more closely match the CTE and stiffness of the IC die 900 to the wiring board 100.

Figure 9D:
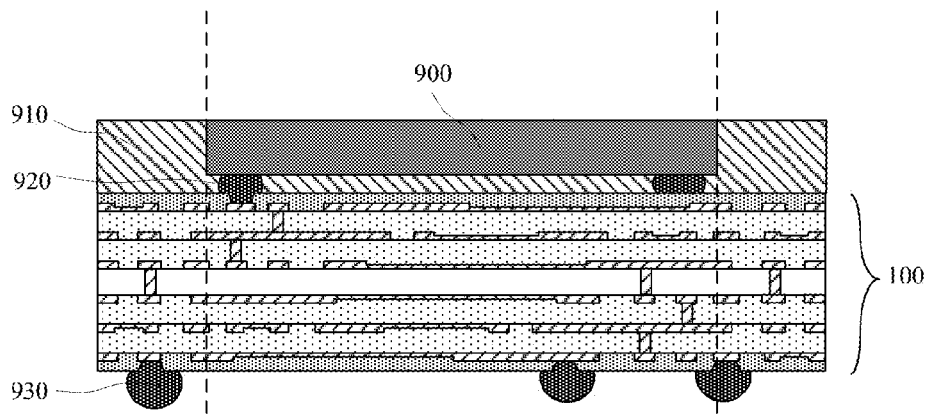
FIG. 9D a schematic cross-sectional side view illustration of a package in accordance with an embodiment.

Referring now to FIG. 9D, the area ratios for multiple metal layers, or all metal layers, can be adjusted to address both localized and global warpage of the package, for example, due to the CTE and stiffness differences between the IC die, molding compound 910, and wiring board. In an embodiment, an area ratio sum of multiple metal layers directly below the IC die 900 is represented by equation (3):

$$AR_{(sum\ MA)} = AR_{M1A} + AR_{M2A} + \ldots AR_{MnA} \quad (3)$$

where $AR_{M1A}$ corresponds to the area ratio of a first metal layer as determined by equation (1) above, $AR_{M2A}$ corresponds to the area ratio of a second metal layer as determined by equation (1), and $AR_{MnA}$ corresponds to the area ratio of an nth metal layer as determined by equation (1).

In an embodiment, an area ratio sum of multiple metal layers outside the IC die 900, and not directly below the IC die 900 is represented by equation (4):

$$AR_{(sum\ MB)} = AR_{M1B} + AR_{M2B} + \ldots AR_{MnB} \quad (4)$$

where $AR_{M1B}$ corresponds to the area ratio of a first metal layer as determined by equation (2) above, $AR_{M2B}$ corresponds to the area ratio of a second metal layer as determined by equation (2), and $AR_{MnB}$ corresponds to the area ratio of an nth metal layer as determined by equation (2).

In an embodiment $AR_{(sum\ MB)}$ is greater than $AR_{(sum\ MA)}$. Referring again to FIG. 9C, in an embodiment the illustration of FIG. 9C is applicable to an area ratio sum of multiple metal layers or all metal layers within the wiring board 100 where a larger area of reduced thickness 106 in multiple metal layers is visually represented directly below the IC die 900, and a larger area of baseline thickness 102 in multiple metal layers is visually represented outside of the IC die 900.

Figure 10A:
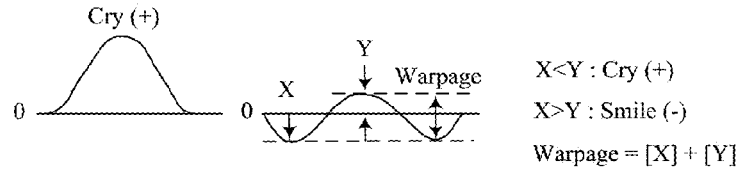
FIGS. 10A-10B are graphical illustrations of characterizing warpage form of a package.
Figure 10B:
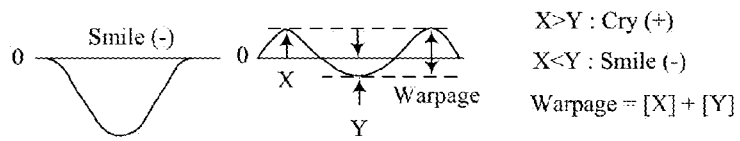

FIGS. 10A-10B are graphical illustrations of characterizing warpage form of a package. Referring to FIG. 10A, a surface profile (or warpage contour) characterized as "Cry" is illustrated, where the surface profile is distorted in a positive direction about a neutral axis. An area X of the package is illustrated as distorted in a negative direction, with area Y distorted in the positive direction. The package is characterized as having a positive warpage, or Cry, where Y is greater than X. The package is characterized as having a negative warpage, or Smile, where X is greater than Y. The total warpage of the package related to the resultant Z-height of the package is the sum of the maximum absolute value of positive warpage and negative warpage.

Referring to FIG. 10B, a surface profile (or warpage contour) characterized as "Smile" is illustrated, where the surface profile is distorted in a negative direction about a neutral axis. An area X of the package is illustrated as distorted in a positive direction, with area Y distorted in the negative direction. The package is characterized as having a positive warpage, or Cry, where X is greater than Y. The package is characterized as having a negative warpage, or Smile, where Y is greater than X. The total warpage of the package related to the resultant Z-height of the package is the sum of the maximum absolute value of positive warpage and negative warpage.

Figure 11:
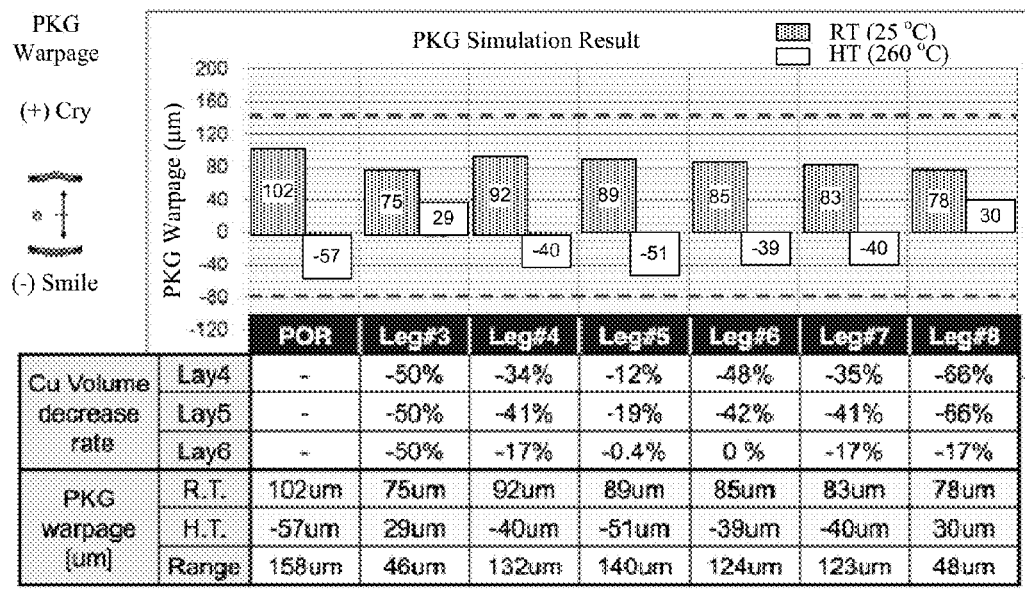
FIGS. 11-13 include package warpage simulation data for a 6 L FCCSP at room temperature and high temperature in accordance with an embodiment.
Figure 12:
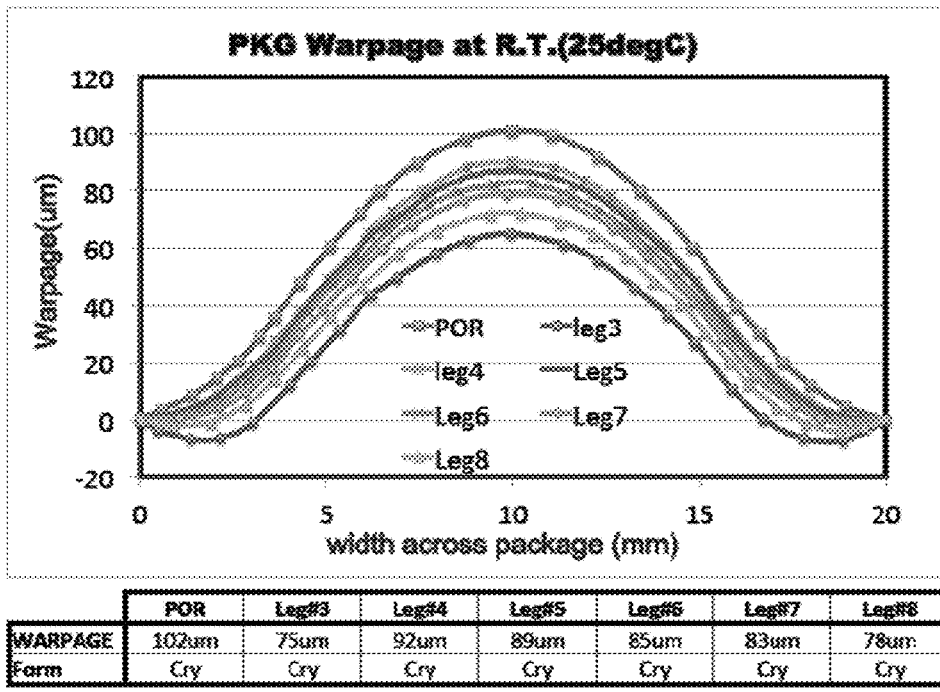
Figure 13:
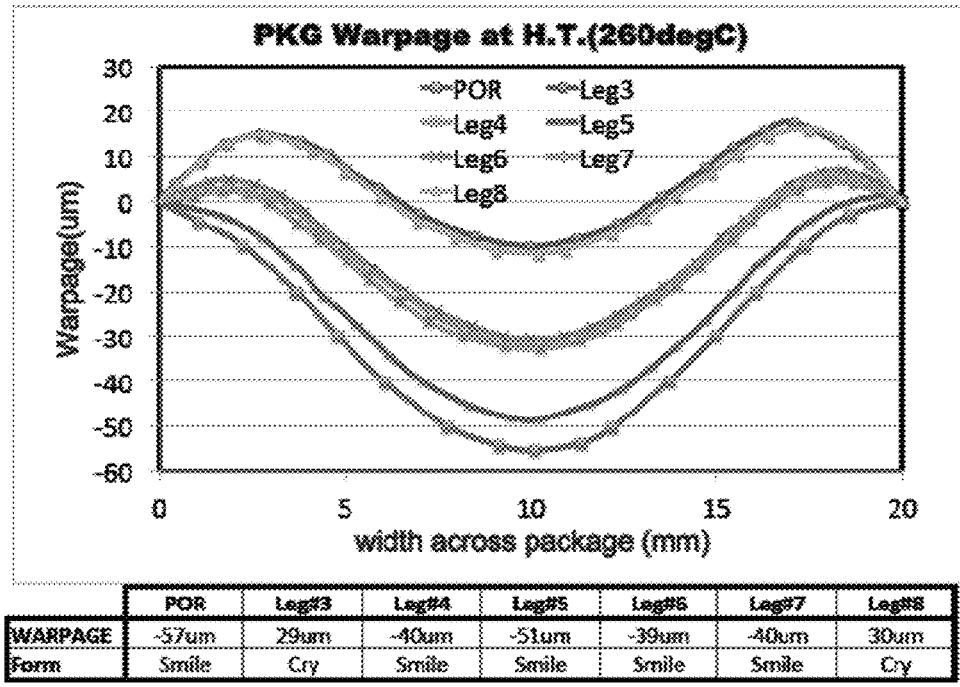

Referring now to FIGS. 11-13 package warpage simulation data is provided for a 6 L FCCSP similar to package described and illustrated in FIGS. 9A-9D in accordance with an embodiment. In particular package warpage is simulated based upon altering the copper volume in metal layers 4-6 of the 6 L design, which correspond to metal layers 116, 118, 120 in the wiring board 100 illustrated in FIG. 1 and FIG. 3. Referring again to FIG. 9A, warpage across the packages is determined diagonally across the package from top left corner to bottom left corner, and across the package from bottom left corner to top right corner, with the maximum values being represented in FIG. 11. As shown in FIG. 11, simulation data is provided for 7 sample configurations at both room temperature (RT) of 25° C. and high temperature (HT) of 260° C.

Example 1

The first sample configuration is the plan of record (POR) in which metal layers 116, 118, 120 (corresponding to layers 4-6) are unmodified, and all have the initial baseline thickness of the layers, for example, 15 µm. Layers 1-3 corresponding to metal layers 110, 112, 114 are unmodified in all 7 sample configurations. The simulation data for the POR demonstrates package warpage with an unmodified wiring board. As shown, the POR demonstrated the highest package warpage at 102 µm at room temperature, and the largest package warpage of −57 µm at high temperature. This corresponds to the highest total warpage range between room temperature and high temperature of 158 µm of all the example configurations.

Example 2

The second example configuration represented by Leg #3. In Leg #3, the entire uniform baseline thickness of metal layers 116, 118, 120 (corresponding to layers 4-6) is reduced to a uniform reduced thickness, including the signal trace lines and the metal planes. Thus, the uniform baseline thickness of layers 116, 118, 120 is reduced from 15 µm to a uniform reduced thickness of 7.5 µm, for example. The simulation data for Leg #3 demonstrates the effectiveness of reducing metal layer thickness, as a general principle. However, as described above, this may not be the most feasible modification in practice due to design constraints related to minimum metal (copper) thickness of the signal trace lines. As provided in FIG. 11, Leg #3 demonstrated the lowest total warpage range between room temperature and high temperature of 46 µm.

Examples 3-7

The remaining example configurations are represented by Legs #4-8 in which the amount of copper volume decrease per metal layer is varied among layers for the same wiring configuration as the POR in accordance with embodiments described herein, in which the thickness of specific portions of copper planes are reduced to a reduced thickness. Additionally, locations for specific reduced thickness of the copper planes are altered in Legs #4-8. As shown, the particular configuration of Leg #8 achieves a total warpage range of 48 μm, which is comparable to Leg #3 above and a 70% reduction compared to the POR.

Referring now to FIGS. 12-13, simulated warpage plots across the sample package configurations are provided at both room temperature and high temperature in accordance with an embodiment, using the highest warpage data across the two diagonal lines illustrated in FIG. 9A. In the particular embodiments illustrated in FIGS. 12-13, the packages are each approximately 20 mm wide diagonally from corner to corner, with the 1-4 mm and 16-20 mm corresponding to the molding compound area, and 4-20 mm corresponding to the IC die area. As shown in FIG. 12, each sample configuration has a "Cry" surface profile (or warpage contour) from corner to corner at room temperature, with the Leg #3 and Leg #8 having the flattest profiles, or lowest package warpage. As shown in FIG. 13, Leg #3 and Leg #8 have a "Cry" profile, with the other example configurations each having a "Smile" profile, with Leg #3 and Leg #8 again having the flattest profiles, or lowest package warpage.

In accordance with embodiments, the simulation data provided in FIGS. 11-13 illustrates that selective reduction of copper thickness in copper ground planes can be used to alter the package surface profile (or warpage contour) from corner to corner. At room temperature, the package surface profile corresponds to Z-height of the package. Thus, embodiments may be used for Z-height reduction of packages. The high temperature warpage is associated with elevated temperatures during assembly, such as solder reflow or molding compound cure. Package warpage at high temperature has been associated with assembly yield, and the formation of cold joints. Thus, embodiments may be also used for addressing assembly yield, and the reduction of cold joints. In these manners, both global warpage and localized warpage can be addressed in high resolution, on the order of 1 mm by 1 mm, with selective reduction of copper thickness in copper ground planes.

In utilizing the various aspects of the embodiments, it would become apparent to one skilled in the art that combinations or variations of the above embodiments are possible for addressing package warpage. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A semiconductor package comprising:
   a wiring board including:
      a metal trace characterized by a uniform baseline thickness;
      a metal plane laterally adjacent the metal trace, wherein the metal plane includes a baseline portion of the baseline thickness and a reduced portion of a reduced thickness, the reduced thickness less than the baseline thickness;
      wherein a top surface of the metal trace is level with a baseline portion top surface of the metal plane, and a reduced portion top surface of the reduced portion of the metal plane is below the baseline portion top surface; and
   a die mounted on the wiring board above the metal plane, wherein an area of the reduced thickness of the metal plane is directly below the die.

2. The semiconductor package of claim 1, wherein the reduced thickness is a uniform thickness.

3. The semiconductor package of claim 1, wherein the metal plane and the metal trace are in a same metal layer of the wiring board.

4. The semiconductor package of claim 1, further comprising a dielectric layer over the metal trace and the metal plane, wherein the dielectric layer laterally surrounds the metal trace and the metal plane, and covers the reduced portion of the metal plane.

5. The semiconductor package of claim 4, further comprising a via extending through the dielectric layer and in contact with the top surface of the metal trace.

6. The semiconductor package of claim 1, wherein the metal trace is a signal trace line, and the metal plane is selected from the group consisting of a ground plane, power plane, and reference plane.

7. The semiconductor package of claim 1, wherein the wiring board comprises a first metal layer separated from a second metal layer with a first dielectric layer; and
   the first metal layer comprises the metal trace and the metal plane, and the second metal layer comprises a second metal trace and a second metal plane, wherein the second metal plane includes a second baseline portion of a second baseline thickness and a second reduced portion of a second reduced thickness, the second reduced thickness less than the second baseline thickness;
   wherein a second top surface of the second metal trace is level with a second baseline portion top surface of the second metal plane, and a second reduced portion top surface of the second reduced portion of the second metal plane is below the second baseline portion top surface.

8. The semiconductor package of claim 7, wherein the baseline thickness and the second baseline thickness are the same.

9. The semiconductor package of claim 8, wherein the reduced thickness and the second reduced thickness are the same.

10. The semiconductor package of claim 1, wherein the wiring board comprises a first metal layer characterized by:
    a first area ratio of the baseline thickness:reduced thickness directly below the die;
    a second area ratio of the baseline thickness:reduced thickness outside of the die, not directly below the die; and
    the second area ratio is greater than the first area ratio.

11. The semiconductor package of claim 1, wherein the wiring board comprises a plurality of metal layers, with each metal layer comprising a corresponding baseline thickness and reduced thickness, the plurality of metal layers characterized by:
    a first area ratio sum of the plurality of metal layers of the baseline thicknesses:reduced thicknesses directly below the die;
    a second area ratio sum of the plurality of metal layers of the baseline thicknesses:reduced thicknesses outside of the die, not directly below the die; and
    the second area ratio sum is greater than the first area ratio sum.

12. The semiconductor package of claim 1, wherein the wiring board is a high density interconnect (HDI) board.

13. The semiconductor package of claim 1, wherein the wiring board comprises:
- a core layer;
- a second metal trace and a second metal plane laterally adjacent to the second metal trace on an opposite side of the core layer than the metal trace and the metal plane;
- wherein the second metal trace is characterized by a uniform second baseline thickness, and the second metal plane includes a second baseline portion of the second baseline thickness and a second reduced portion of a second reduced thickness, the second reduced thickness less than the second baseline thickness; and
- wherein a second bottom surface of the second metal trace is level with a second baseline portion top surface of the second metal plane, and a second reduced portion bottom surface of the second reduced portion of the second metal plane is above the second baseline portion top surface.

14. The semiconductor package of claim 1, wherein the semiconductor package is integrated into a mobile electronics device.

15. The semiconductor package of claim 1, wherein the metal trace and the metal plane comprise copper.

16. A semiconductor package comprising:
- a wiring board including:
  - a copper layer including a signal trace line and a copper plane selected from the group consisting of a ground plane, power plane, and reference plane;
  - wherein the signal trace line is characterized by a uniform baseline thickness, and the copper plane includes a baseline portion of the baseline thickness and a reduced portion of a reduced thickness, the reduced thickness less than the baseline thickness;
  - wherein a top surface of the signal trace is level with a baseline portion top surface of the copper plane, and a reduced portion top surface of the reduced portion of the copper plane is below the baseline portion top surface; and
- a die mounted on the wiring board above the copper plane, wherein an area of the reduced thickness of the copper layer is directly below the die.

17. The semiconductor package of claim 16, wherein the copper layer is characterized by:
- a first area ratio of the baseline thickness:reduced thickness directly below the die; and
- a second area ratio of the baseline thickness:reduced thickness outside of the die, not directly below the die; and
- the second area ratio is greater than the first area ratio.

18. A semiconductor package comprising:
- a wiring board including:
  - a first copper layer separated from a second copper layer with a first dielectric layer;
  - wherein the first copper layer comprises a first signal trace line characterized by a uniform first baseline thickness and a first copper plane selected from the group consisting of a ground plane, power plane, and reference plane; and the first copper plane includes a first baseline portion of the first baseline thickness and a first reduced portion of a first reduced thickness, the first reduced thickness less than the first baseline thickness;
  - wherein a top surface of the first signal trace line is level with a first baseline portion top surface of the first copper plane, and a first reduced portion top surface of the first reduced portion of the first copper plane is below the first baseline portion top surface;
  - wherein the second copper layer comprises a second signal trace line and a second copper plane selected from the group consisting of a ground plane, power plane, and reference plane; and the second copper plane includes a second baseline portion of the second baseline thickness and a second reduced portion of a second reduced thickness, the second reduced thickness less than the second baseline thickness;
  - wherein a second top surface of the second signal trace line is level with a second baseline portion top surface of the second copper plane, and a second reduced portion top surface of the second reduced portion of the second copper plane is below the second baseline portion top surface; and
- a die mounted on the wiring board above the first and second copper layers, wherein a first area of the first reduced thickness of the first copper layer and second area of the second reduced thickness of the second copper layer are directly below the die.

19. The semiconductor package of claim 18:
wherein the first copper layer is characterized by:
- a first copper layer first area ratio of the first baseline thickness:first reduced thickness directly below the die;
- a first copper layer second area ratio of the first baseline thickness:first reduced thickness outside of the die, not directly below the die; and
- the first copper layer second area ratio is greater than the first copper layer first area ratio; and wherein the second copper layer is characterized by:
- a second copper layer first area ratio of the second baseline thickness:second reduced thickness directly below the die;
- a second copper layer second area ratio of the second baseline thickness:second reduced thickness outside of the die, not directly below the die; and
- the second copper layer second area ratio is greater than the second copper layer first area ratio.

20. The semiconductor package of claim 19: wherein the first copper layer and the second copper layer are characterized by:
- a first area ratio sum of the first copper layer first area ratio and the second copper layer first area ratio;
- a second area ratio sum of the first copper layer second area ratio and the second copper layer second area ratio; and
- the second area ratio sum is greater than the first area ratio sum.

* * * * *